(12) United States Patent  (10) Patent No.: US 7,288,970 B2
Bertin  (45) Date of Patent: Oct. 30, 2007

(54) INTEGRATED NANOTUBE AND FIELD EFFECT SWITCHING DEVICE

(75) Inventor: Claude L. Bertin, Burlington, VT (US)

(73) Assignee: Nantero, Inc., Woburn, MA (US)

( * ) Notice: Subject to any disclaimer, the term of this patent is extended or adjusted under 35 U.S.C. 154(b) by 62 days.

(21) Appl. No.: 11/033,089

(22) Filed: Jan. 10, 2005

(65) Prior Publication Data

US 2006/0061389 A1   Mar. 23, 2006

Related U.S. Application Data

(60) Provisional application No. 60/581,015, filed on Jun. 18, 2004.

(51) Int. Cl.
*H03K 19/20* (2006.01)
(52) U.S. Cl. .................. 326/120; 326/112; 977/940
(58) Field of Classification Search ........ 326/112–114, 326/120, 136; 977/700, 940
See application file for complete search history.

(56) References Cited

U.S. PATENT DOCUMENTS

| | | |
|---|---|---|
| 4,044,343 A | 8/1977 | Uchida |
| 4,979,149 A | 12/1990 | Popovic et al. |
| 5,414,654 A | 5/1995 | Kubota et al. |
| 5,578,976 A | 11/1996 | Yao |
| 5,677,823 A | 10/1997 | Smith |
| 5,682,345 A | 10/1997 | Roohparvar et al. |
| 5,818,748 A | 10/1998 | Bertin et al. |
| 5,903,010 A | 5/1999 | Flory et al. |
| 6,097,241 A | 8/2000 | Bertin et al. |
| 6,097,243 A | 8/2000 | Bertin et al. |
| 6,128,214 A | 10/2000 | Kuekes et al. |
| 6,159,620 A | 12/2000 | Heath et al. |
| 6,160,230 A | 12/2000 | McMillan et al. |

(Continued)

FOREIGN PATENT DOCUMENTS

WO   WO 01/03208 A1   1/2001

(Continued)

OTHER PUBLICATIONS

International Search Report for PCT/US05/18535, mailed Aug. 17, 2006, 4 pages.

(Continued)

*Primary Examiner*—James H. Cho
(74) *Attorney, Agent, or Firm*—Wilmer Cutler Pickering Hale and Dorr LLP

(57) ABSTRACT

Hybrid switching devices integrate nanotube switching elements with field effect devices, such as NFETs and PFETs. A switching device forms and unforms a conductive channel from the signal input to the output subject to the relative state of the control input. In embodiments of the invention, the conductive channel includes a nanotube channel element and a field modulatable semiconductor channel element. The switching device may include a nanotube switching element and a field effect device electrically disposed in series. According to one aspect of the invention, an integrated switching device is a four-terminal device with a signal input terminal, a control input terminal, a second input terminal, and an output terminal. The devices may be non-volatile. The devices can form the basis for a hybrid NT-FET logic family and can be used to implement any Boolean logic circuit.

26 Claims, 7 Drawing Sheets

U.S. PATENT DOCUMENTS

| | | |
|---|---|---|
| 6,183,714 B1 | 2/2001 | Smalley et al. |
| 6,198,655 B1 | 3/2001 | Heath et al. |
| 6,221,330 B1 | 4/2001 | Moy et al. |
| 6,232,706 B1 | 5/2001 | Dai et al. |
| 6,345,362 B1 | 2/2002 | Bertin et al. |
| 6,346,846 B1 | 2/2002 | Bertin et al. |
| 6,348,700 B1 | 2/2002 | Ellenbogen et al. |
| 6,353,552 B2 | 3/2002 | Sample et al. |
| 6,373,771 B1 | 4/2002 | Fifield et al. |
| 6,376,787 B1 | 4/2002 | Martin et al. |
| 6,423,583 B1 | 7/2002 | Avouris et al. |
| 6,426,687 B1 | 7/2002 | Osborn |
| 6,445,006 B1 | 9/2002 | Brandes et al. |
| 6,518,156 B1 | 2/2003 | Chen et al. |
| 6,548,841 B2 | 4/2003 | Frazier et al. |
| 6,559,468 B1 | 5/2003 | Kuekes et al. |
| 6,574,130 B2 | 6/2003 | Segal et al. |
| 6,597,048 B1 | 7/2003 | Kan |
| 6,625,047 B2 | 9/2003 | Coleman, Jr. |
| 6,625,740 B1 | 9/2003 | Datar et al. |
| 6,643,165 B2 | 11/2003 | Segal et al. |
| 6,661,270 B2 | 12/2003 | Nagata |
| 6,673,424 B1 | 1/2004 | Lindsay et al. |
| 6,706,402 B2 | 3/2004 | Rueckes et al. |
| 6,706,566 B2 | 3/2004 | Avouris et al. |
| 6,741,334 B2 | 5/2004 | Asano et al. |
| 6,750,471 B2 | 6/2004 | Behune |
| 6,759,693 B2 | 7/2004 | Vogeli et al. |
| 6,760,245 B2 | 7/2004 | Eaton, Jr. et al. |
| 6,774,052 B2 | 8/2004 | Vogeli et al. |
| 6,781,166 B2 | 8/2004 | Lieber et al. |
| 6,784,028 B2 | 8/2004 | Rueckes et al. |
| 6,794,914 B2 | 9/2004 | Sani et al. |
| 6,803,840 B2 | 10/2004 | Hunt et al. |
| 6,809,465 B2 | 10/2004 | Jin |
| 6,835,591 B2 | 12/2004 | Rueckes et al. |
| 6,835,613 B2 | 12/2004 | Schlaf |
| 6,884,734 B2 | 4/2005 | Buehrer et al. |
| 6,919,740 B2 | 7/2005 | Snider |
| 6,946,410 B2 | 9/2005 | French et al. |
| 6,955,937 B1 | 10/2005 | Burke et al. |
| 6,968,486 B2 | 11/2005 | Matsushima |
| 6,969,651 B1 | 11/2005 | Lu et al. |
| 6,986,962 B2 | 1/2006 | Oyanagi et al. |
| 6,990,009 B2 * | 1/2006 | Bertin et al. ................ 365/151 |
| 7,015,500 B2 | 3/2006 | Choi et al. |
| 7,054,194 B2 | 5/2006 | Liaw et al. |
| 7,071,023 B2 | 7/2006 | Bertin et al. |
| 2001/0023986 A1 | 9/2001 | Mancevski |
| 2002/0130311 A1 | 9/2002 | Lieber et al. |
| 2002/0130353 A1 | 9/2002 | Lieber et al. |
| 2002/0172963 A1 | 11/2002 | Kelley et al. |
| 2002/0173083 A1 | 11/2002 | Avouris et al. |
| 2002/0175390 A1 | 11/2002 | Goldstein et al. |
| 2002/0179434 A1 | 12/2002 | Dai et al. |
| 2003/0018630 A1 | 1/2003 | Indeck et al. |
| 2003/0021141 A1 | 1/2003 | Segal et al. |
| 2003/0021966 A1 | 1/2003 | Segal et al. |
| 2003/0022428 A1 | 1/2003 | Segal et al. |
| 2003/0124325 A1 | 7/2003 | Rueckes et al. |
| 2003/0124837 A1 | 7/2003 | Rueckes et al. |
| 2003/0132823 A1 | 7/2003 | Hyman et al. |
| 2003/0165074 A1 | 9/2003 | Segal et al. |
| 2003/0177450 A1 | 9/2003 | Nugent |
| 2003/0198812 A1 | 10/2003 | Rueckes et al. |
| 2003/0199172 A1 | 10/2003 | Rueckes et al. |
| 2003/0200521 A1 | 10/2003 | DeHon et al. |
| 2003/0206436 A1 | 11/2003 | Eaton et al. |
| 2003/0234407 A1 | 12/2003 | Vogeli et al. |
| 2003/0236000 A1 | 12/2003 | Vogeli et al. |
| 2004/0023514 A1 | 2/2004 | Moriya et al. |
| 2004/0075125 A1 | 4/2004 | Asao |
| 2004/0075159 A1 | 4/2004 | Vogeli |
| 2004/0077107 A1 | 4/2004 | Vogeli |
| 2004/0085805 A1 | 5/2004 | Segal et al. |
| 2004/0087162 A1 | 5/2004 | Vogeli |
| 2004/0099438 A1 | 5/2004 | Arthur et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0198030 A1 | 10/2004 | Buehrer et al. |
| 2004/0214366 A1 | 10/2004 | Segal et al. |
| 2004/0214367 A1 | 10/2004 | Segal et al. |
| 2004/0238907 A1 | 12/2004 | Pinkerton et al. |
| 2005/0007002 A1 | 1/2005 | Golovchenko et al. |
| 2005/0035344 A1 | 2/2005 | Bertin et al. |
| 2005/0035367 A1 | 2/2005 | Bertin et al. |
| 2005/0035786 A1 | 2/2005 | Bertin et al. |
| 2005/0035787 A1 | 2/2005 | Bertin et al. |
| 2005/0036365 A1 | 2/2005 | Bertin et al. |
| 2005/0037547 A1 | 2/2005 | Bertin et al. |
| 2005/0041465 A1 | 2/2005 | Rueckes et al. |
| 2005/0041466 A1 | 2/2005 | Rueckes et al. |
| 2005/0047244 A1 | 3/2005 | Rueckes et al. |
| 2005/0052894 A1 | 3/2005 | Segal et al. |
| 2005/0053525 A1 | 3/2005 | Segal et al. |
| 2005/0056825 A1 | 3/2005 | Bertin et al. |
| 2005/0056866 A1 | 3/2005 | Bertin et al. |
| 2005/0056877 A1 | 3/2005 | Rueckes et al. |
| 2005/0058590 A1 | 3/2005 | Sen et al. |
| 2005/0058797 A1 | 3/2005 | Sen et al. |
| 2005/0058834 A1 | 3/2005 | Rueckes et al. |
| 2005/0059176 A1 | 3/2005 | Rueckes et al. |
| 2005/0059210 A1 | 3/2005 | Rueckes et al. |
| 2005/0062035 A1 * | 3/2005 | Bertin et al. ................ 257/20 |
| 2005/0062062 A1 | 3/2005 | Bertin et al. |
| 2005/0062070 A1 | 3/2005 | Bertin et al. |
| 2005/0063210 A1 | 3/2005 | Segal et al. |
| 2005/0063244 A1 | 3/2005 | Bertin et al. |
| 2005/0065741 A1 | 3/2005 | Segal et al. |
| 2005/0068128 A1 | 3/2005 | Yip |
| 2005/0074926 A1 | 4/2005 | Bertin et al. |
| 2005/0101112 A1 | 5/2005 | Rueckes et al. |
| 2005/0128788 A1 | 6/2005 | Segal et al. |
| 2005/0139902 A1 | 6/2005 | Jung |
| 2005/0141266 A1 | 6/2005 | Jung |
| 2005/0141272 A1 | 6/2005 | Jung |
| 2005/0162896 A1 | 7/2005 | Jung |
| 2005/0174842 A1 | 8/2005 | Bertin et al. |
| 2005/0191495 A1 | 9/2005 | Rueckes et al. |
| 2005/0237781 A1 | 10/2005 | Bertin et al. |
| 2005/0269553 A1 | 12/2005 | Sen et al. |
| 2005/0269554 A1 | 12/2005 | Sen et al. |
| 2005/0270824 A1 | 12/2005 | Bertin et al. |
| 2005/0279988 A1 | 12/2005 | Bertin |
| 2005/0280436 A1 | 12/2005 | Bertin |
| 2005/0281084 A1 | 12/2005 | Rueckes et al. |
| 2005/0282515 A1 | 12/2005 | Betin |
| 2005/0282516 A1 | 12/2005 | Bertin |
| 2006/0044035 A1 | 3/2006 | Bertin |
| 2006/0061389 A1 | 3/2006 | Bertin |
| 2006/0125033 A1 | 6/2006 | Segal et al. |
| 2006/0128049 A1 | 6/2006 | Jaiprakash et al. |
| 2006/0183278 A1 | 8/2006 | Bertin et al. |
| 2006/0193093 A1 | 8/2006 | Bertin et al. |
| 2006/0204427 A1 | 9/2006 | Ghenciu et al. |
| 2006/0231865 A1 | 10/2006 | Bertin et al. |
| 2006/0237805 A1 | 10/2006 | Bertin et al. |
| 2006/0250843 A1 | 11/2006 | Bertin et al. |
| 2006/0250856 A1 | 11/2006 | Bertin et al. |
| 2006/0255834 A1 | 11/2006 | Ward et al. |
| 2006/0276056 A1 | 12/2006 | Ward et al. |

2007/0015303 A1  1/2007 Bertin et al.

FOREIGN PATENT DOCUMENTS

| WO | WO 01/44796 A1 | 6/2001 |
|---|---|---|
| WO | WO 03/091486 A1 | 11/2003 |
| WO | WO 04/065655 A1 | 8/2004 |
| WO | WO 04/065657 A1 | 8/2004 |
| WO | WO 04/065671 A1 | 8/2004 |

OTHER PUBLICATIONS

AMI, S. et al., "Logic gates and memory cells based on single $C_{60}$ electromechanical transistors," Nanotechnology, vol. 12, pp. 44-52. 2001, no date.

Avouris, P. et al., "Carbon Nanotube Electronics," Chemical Physics, vol. 281, pp. 429-445. 2002, no date.

Bachtold, A. et al., "Logic Circuits with Carbon Nanotube Transistors," Science, vol. 294, pp. 1317-1320. Nov. 9, 2001.

Bachtold, A. et al., "Logic Circuits Based on Carbon Nanotubes," Physica E, 2003, vol. 16, pp. 42-46, no date.

Collier, C.P. et al., "Electronically Configurable Molecular-Based Logic Gates," Science, vol. 285, pp. 391-394. Jul. 16, 1999.

Dehon, A., "Array-Based Architecture for FET-Based, Nanoscale Electronics", IEEE Transactions on Nanotechnology, vol. 2(1), pp. 23-32. Mar. 2003.

Dequesnes, M et al., "Simulation of carbon nanotube-based nanoelectromechanical switches," Computational Nanoscience and Nanotechnology, 2002, pp. 383-386. no date.

Dequesnes, M. et al., "Calculation of pull-in voltages for carbon-nanotube-based nanoelectromechanical switches," Nanotechnology, 2002, vol.13, pp. 120-131. no date.

Derycke, V. et al., "Carbon Nanotube Inter- and Intramolecular Logic Gates," Nano Letters, vol. 1(9), pp. 453-456. Sep. 2001.

Franklin, N.R. et al., "Integration of suspended carbon nanotube arrays into electronic devices and electromechanical systems," Appl. Phys. Lett., vol. 81(5), pp. 915-915. Jul. 29, 2002.

Fuhrer, M.S. et al., "High-Mobility Nanotube Transistor Memory," Nano Letters 2002, vol. 2(7), pp. 755-759. no date.

Hoenlein, W. et al., "Carbon nanotubes for microelectronics: status and future prospects," Materials Science and Engineering, 2003, vol. 23, pp. 663-669. no date.

Huang, Y. et al., "Logic Gates and Computation from Assembled Nanowire Building Blocks," Science, vol. 294, pp. 1313-1316. Nov. 9, 2001.

Javey, A. et al., "Carbon Nanotube Transistor Arrays for Multistage Complementary Logic and Ring Oscillators," Nano Letters, 2002, vol. 2(9), pp. 929-932. no date.

Kinaret, J.M. et al., "A carbon-nanotube-based nanorelay," Applied Physics Letters, vol. 82(8), pp. 1287-1289. Feb. 24, 2003.

Lin, Y.M. et al., "Ambipolar-to-Unipolar Conversion of Carbon Nanotube Transistors by Gate Structure Engineering," Nano Lett. 2004, vol. 4(5), pp. 947-950. no date.

Martel, R. et al., "Carbon Nanotube Field-Effect Transistors and Logic Circuits," DAC, 2002, vol. 7.4, pp. 94-98. no date.

Rueckes, T. et al., "Carbon Nanotube-Based Nonvolatile Random Access Memory for Molecular Computing," Science, vol. 289, pp. 94-97. Jul. 7, 2000.

Tans, S.J. et al., "Room-temperature transistor based on a single carbon nanotube," Nature, vol. 393, pp. 49-52. May 7, 1998.

Zhan, W. et al., "Microelectrochemical Logic Circuits," J. Am. Chem. Soc., 2003, vol. 125, pp. 9934-9935. no date.

Bernholc et al., "Mechanical and electrical properties of nanotubes", *Ann. Rev. Mater. Res.*, vol. 32, p. 347, 2002, no month.

Bradley, K. et al., "Flexible Nanotube Electronics", *Nano Letters*, vol. 3, No. 10, pp. 1353-1355. 2003, no month.

Collins, et al., "Engineering Carbon Nanotubes and Nanotube Circuits Using Electrical Breakdown", Science, vol. 292, pp. 706-709, Apr. 2001.

Kinaret, J. M. et al., "A Carbon-nanotube-based nanorelay," *Applied Physics Letters*, 24 Feb. 2003, vol. 82, No. 8, pp. 1287-1289.

Martel, R., et al, "Carbon Nanotube Field-Effect Transistors and Logic Circuits." DAC 2002, Jun. 10-12, 2002, vol. 7.4, pp. 94-98.

ONOA et al., "Bulk Production of singly dispersed carbon nanotubes with prescribed lengths", *Nanotechnology*, vol. 16, pp. 2799-2803, 2005 no month.

Stadermann, M. et al., "Nanoscale study of conduction through carbon nanotube networks", *Phys. Rev. B 69*, 201402(R), 2004 no month.

\* cited by examiner

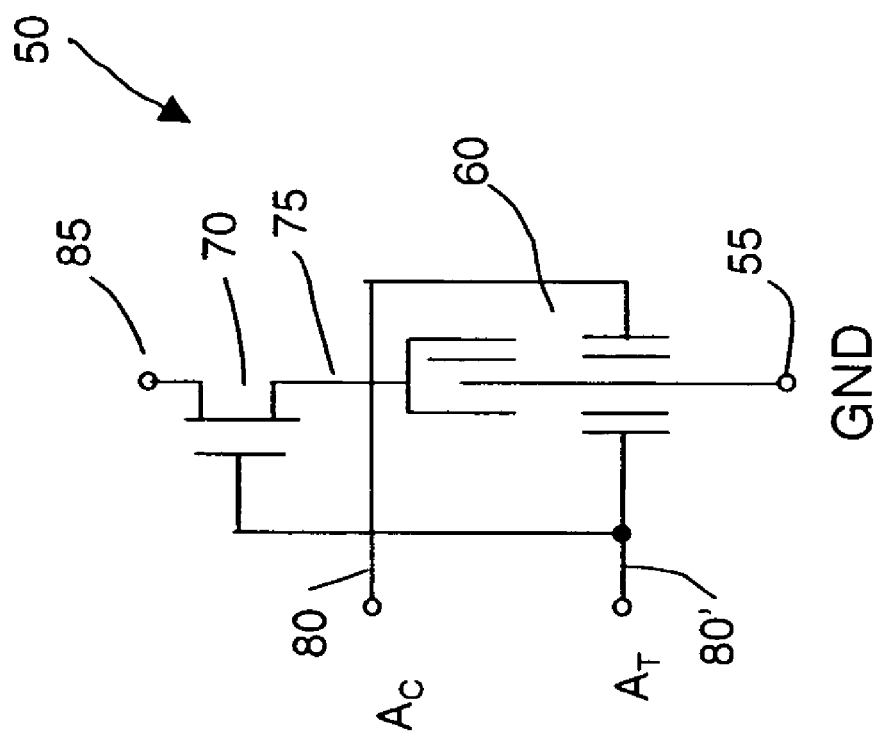
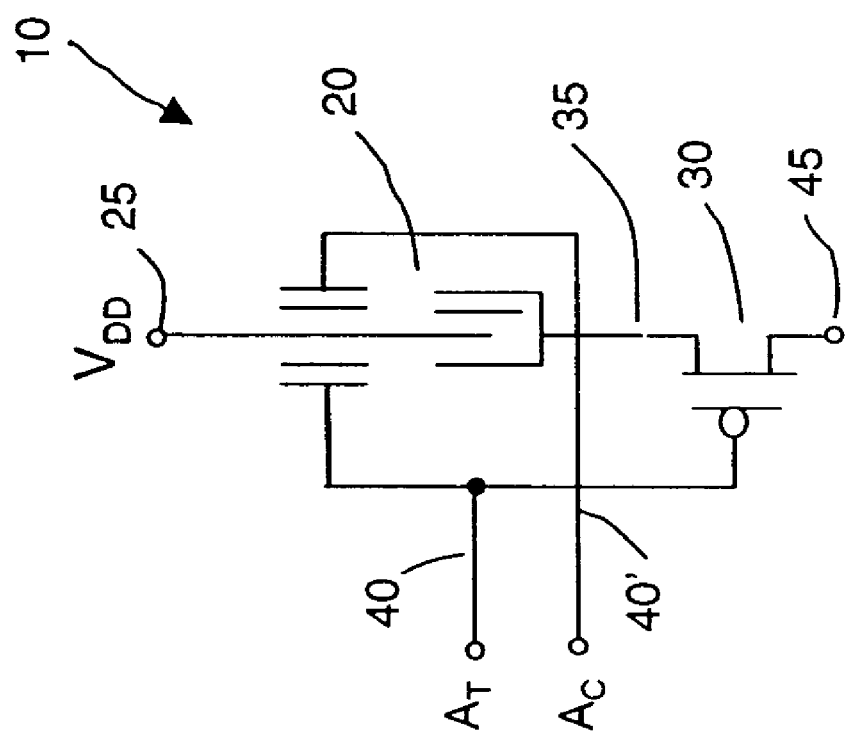
Figure 1A
Figure 1B

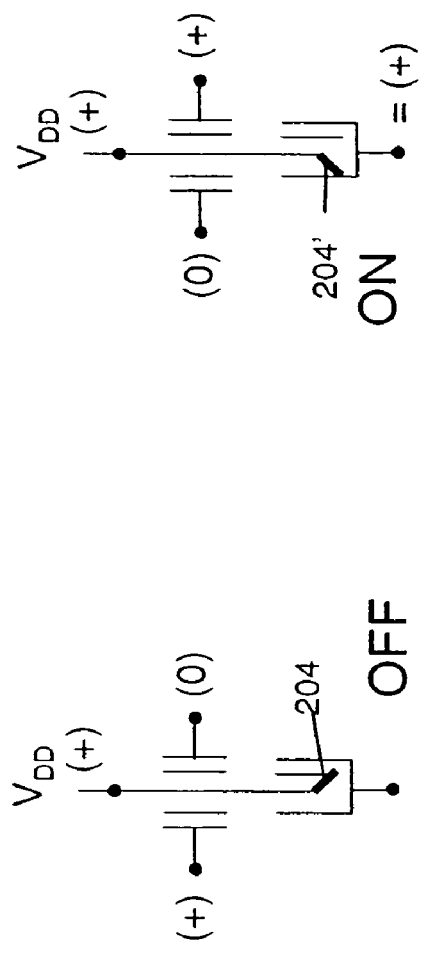
Figure 2A
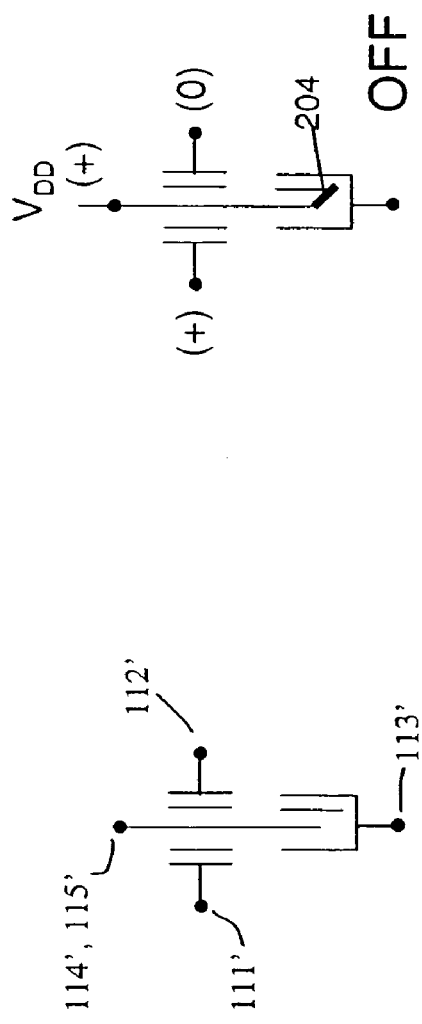
Figure 3A
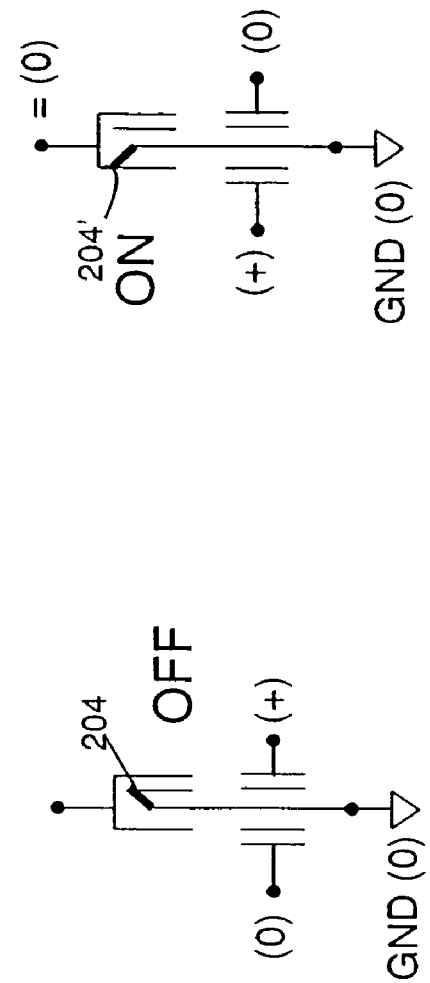
Figure 2B
Figure 2C
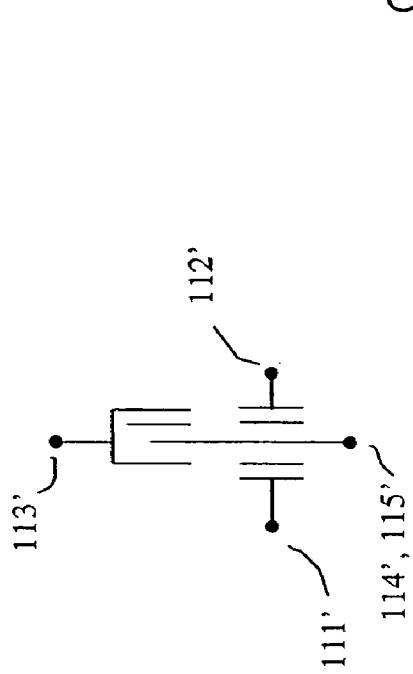
Figure 3B
Figure 3C

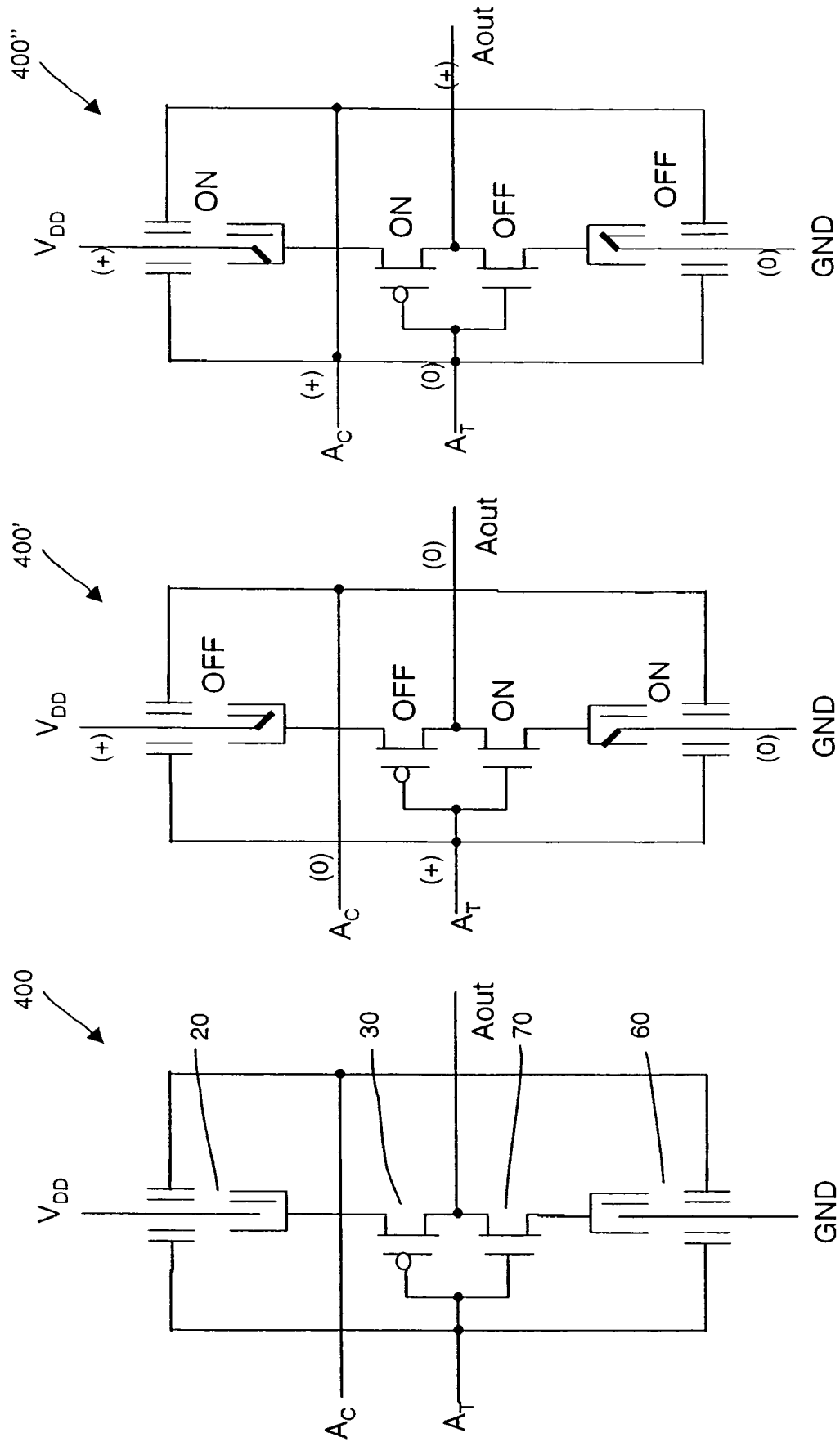

INTEGRATED NANOTUBE AND FIELD EFFECT SWITCHING DEVICE

CROSS-REFERENCE TO RELATED APPLICATIONS

This application claims priority under 35 U.S.C. § 119(e) to U.S. Provisional Pat. Apl., Ser. No. 60/581,015, filed on Jun. 18, 2004, entitled Nonvolatile Carbon Nanotube Logic (NLOGIC) and CMOS Inverter, which is incorporated herein by reference in its entirety.

This application is related to the following applications:

U.S. patent application Ser. No. 10/917,794, filed on Aug. 13, 2004, entitled Nanotube-Based Switching Elements, now Publication No. 2005/0035367;

U.S. patent application Ser. No. 10/918,085, filed on Aug. 13, 2004, entitled Nanotube-Based Switching Elements With Multiple Controls, now U.S. Pat. No. 6,990,009;

U.S. patent application Ser. No. 10/918,181, filed on Aug. 13, 2004, entitled Nanotube Device Structure And Methods Of Fabrication, now U.S. Pat. No. 7,071,023;

U.S. patent application Ser. No. 10/917,893, filed on Aug. 13, 2004, entitled Nanotube-Based Switching Elements And Logic Circuits, now Publication No. 2005/0035787;

U.S. patent application Ser. No. 10/917,606, filed on Aug. 13, 2004, entitled Isolation Structure For Deflectable Nanotube Elements, now Publication No. 2005/0035344;

U.S. patent application Ser. No. 11/033,087, filed on Jan. 10, 2005, entitled Nanotube-Based Transfer Devices and Related Circus, now Publication No. 2005/0279988;

U.S. patent application Ser. No. 11/033,213, filed on Jan. 10, 2005, entitled Receiver Circuit Using Nanotube-Based Switches and Transistors, now Publication No. 2005/0282515;

U.S. patent application Ser. No. 11/033,215, filed on Jan. 10, 2005, entitled Receiver Circuit Using Nanotube-based Switches and Logic, now Publication No. 2005/0282516;

U.S. patent application Ser. No. 11/033,216, filed on Jan. 10, 2005, entitled Nanotube-based Logic Driver Circuits, now Publication No. 2005/0280436;

U.S. patent application Ser. No. 11/032983, filed on Jan. 10, 2005, entitled Storage Elements Using Nanotube Switching Elements, now Publication No. 2006/0044035; and U.S. patent application Ser. No. 11/032823, filed on Jan. 10, 2005, entitled Tri-State Circuit Using Nanotube Switching Elements.

BACKGROUND

1. Technical Field

The present invention generally relates to switching elements and logic circuits, and in particular to switching elements that integrate nanotube switching technology, in which nanotubes provide conductive channels in switches, with field effect switching technology and logic circuits formed therefrom.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or heavy radiation. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to heavy radiation because the radiation generates electrical currents inside the semiconductor material. It is possible to manufacture integrated circuits with special devices and isolation techniques so that they remain operational when exposed to heavy radiation, but the high cost of these devices limits their availability and practicality. In addition, radiation hardened digital circuits exhibit timing differences from their normal counterparts, requiring additional design verification to add radiation protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Resistance to radiation and the ability to function correctly at elevated temperatures also expand the applicability of digital logic. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes (NT), to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, using nanotube ribbons. Such circuits include a structure having electrically conductive traces and supports extending from a surface of a substrate. Nanotube ribbons that can electromechanically deform, or switch, are suspended by the supports that cross the electrically conductive traces. Each ribbon comprises one or more nanotubes. The ribbons are typically formed by selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electromechanical switches based on carbon nanotubes (including mono-layers constructed thereof) and metal electrodes has been detailed in previous patent applications of Nantero, Inc. (U.S. Pat. Nos. 6,574,130, 6,643,165, 6706402; U.S. patent application Ser. Nos. 09/915,093, 10/033,323, 10/033,032, 10/128,117, 10/341,005, 10/341,055, 10/341,054, 10/341, 130, 10/776,059, 10/776,572, 10/917,794, and 10/918,085 the contents of which are hereby incorporated by reference in their entireties).

BRIEF DESCRIPTION OF THE DRAWINGS

FIG. 1A is a schematic representation of an non-volatile integrated nanotube switching element and PFET device (or NT-PFET device) according to one aspect of the invention;

FIG. 1B is a schematic representation of an non-volatile integrated nanotube switching element and NFET device (or NT-NFET device) according to one aspect of the invention;

FIGS. 2A–C and 3A–C are schematic representations of nanotube switching element 100 of FIG. 1C in pull-up and pull-down configurations, respectively;

FIG. 4A is a schematic representation of an inverter constructed using a non-volatile integrated NT-PFET device and a non-volatile integrated NT-NFET device as shown in FIGS. 1A and 1B, according to one aspect of the invention;

FIG. 4B is a schematic representation of the inverter of FIG. 4A in one possible logic state;

FIG. 4C is a schematic representation of the inverter of FIG. 4A in one possible logic state;

SUMMARY OF THE INVENTION

Figure 1C:
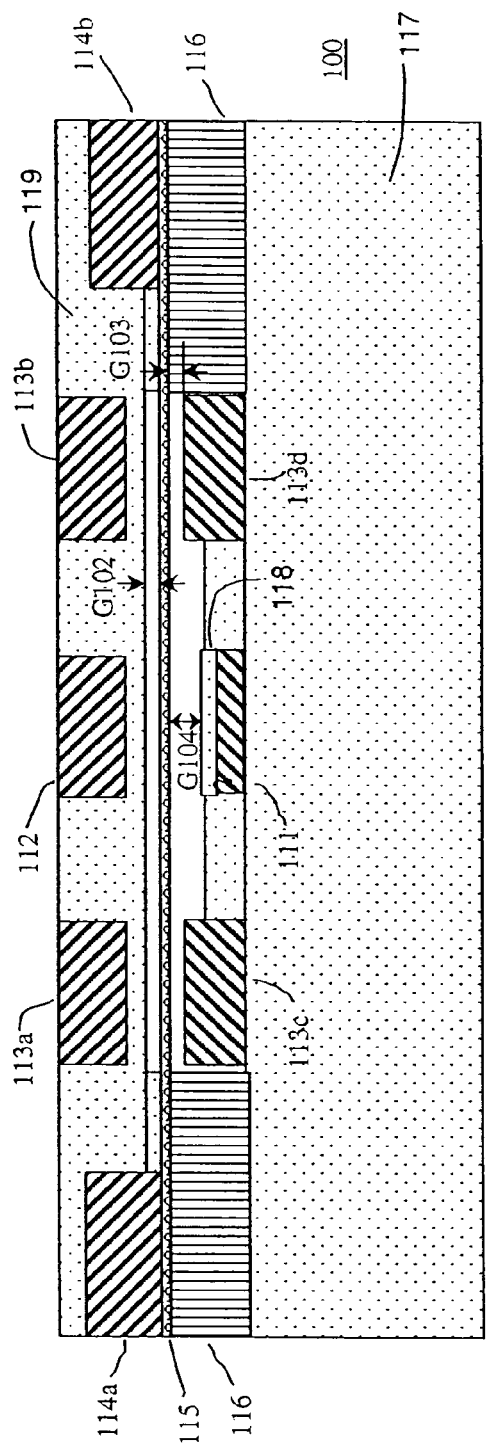
FIGS. 1C and 1D illustrate a cross sectional and plan views of a nanotube switching element fabricated according to preferred embodiments of the invention.

Embodiments of the present invention provide integrated switching devices that combine nanotube (NT) switching elements with field effect semiconductor elements, including but not limited to MOS NFETs and PFETs (FETs).

According to one aspect of the invention, nanotube switching elements are integrated with field effect devices to form hybrid switching devices that are non-volatile.

According to one aspect of the invention, an integrated switching device is a multi-terminal device, with a signal input terminal, at least one control input terminal and an output terminal. An integrated switching device forms and unforms a conductive channel from the signal input to the output subject to the relative state of the control input. The conductive channel includes a nanotube channel element and a field modulatable semiconductor channel element.

According to one aspect of the invention, an integrated switching device is a four-terminal device with two control input terminals, a signal input terminal, and an output terminal.

According to one aspect of the invention, an integrated switching device includes a nanotube switching element and a field effect device interconnected in series. The field effect device may resemble a field effect transistor. A control input node of the nanotube switching element and the gate of the field effect device are logically tied together.

According to one aspect of the invention, an integrated switching device includes a nanotube switching element and a field effect device arranged to limit the leakage current.

According to one aspect of the invention, an integrated switching device includes a network of nanotube switching elements and/or field effect devices.

According to one aspect of the invention, integrated switching devices including a nanotube switching element and a field effect device are used to form logic circuits.

According to one aspect of the invention, an integrated switching device including a nanotube switching element and a field effect device is connected to a power supply and provides a pull-up device.

According to one aspect of the invention, an integrated switching device including a nanotube switching element and a field effect device is connected to ground and provides a pull-down device.

According to one aspect of the invention, an integrated switching device including a nanotube switching element and a field effect device is arranged so that a field effect transistor is proximate to the output terminal.

According to one aspect of the invention, an integrated switching device including a nanotube switching element and a field effect device is arranged so that a nanotube switching element is proximate to the signal input terminal.

According to one aspect of the invention, integrated switching devices including a nanotube switching element and a field effect device are used to provide a device family to implement logic functions.

According to one aspect of the invention, integrated switching devices including a nanotube switching element and a field effect device are used to provide a complementary logic scheme to implement logic functions.

According to one aspect of the invention, integrated switching devices including a nanotube switching element and a field effect device are used to construct dual-rail single-output circuits.

According to one aspect of the invention, integrated switching devices including a nanotube switching element and a field effect device are used to construct dual-rail dual-output circuits.

According to one aspect of the invention, integrated switching devices including a nanotube switching element and a field effect device are used to form logic circuits to implement Boolean operations. A Boolean logic circuit includes at least one input terminal and an output terminal and a network of integrated switching elements including a nanotube switching element and a field effect device electrically disposed between the at least one input terminal and the output terminal. The network performs a Boolean transformation of Boolean signals on the at least one input terminal.

According to one aspect of the invention, circuits using integrated switching devices including a nanotube switching element and a field effect transistor have driving capabilities comparable to CMOS.

According to one aspect of the invention, circuits using integrated switching devices including a nanotube switching element and a field effect transistor are CMOS compatible.

DETAILED DESCRIPTION

Embodiments of the invention provide switching elements with a conductive channel that has both a nanotube component and a field effect semiconductor component. Preferred embodiments of the invention provide integrated hybrid logic devices that use nanotube switching elements in combination with field effect devices resembling field effect transistors (FETs). The integrated devices are referred to herein as NT-FET devices. The NT-FET devices of preferred embodiments form an NT-FET device family. The devices in the NT-FET device family can be used as switching elements and to implement any desired logic function or logical device, such as an inverter. In certain embodiments, an NT-FET device includes a MOSFET, e.g., a p-channel FET (PFET) or an n-channel FET (NFET), placed in series with a nanotube switching element connected to a source ($V_{DD}$ or GND). In preferred embodiments, the gate of the FET is logically tied to a control input of the nanotube switching element. In some embodiments, the source may also be a signal such as an output from other logic. More complex integrated NT-FET devices may include an FET network and/or a nanotube switching element network, rather than a single nanotube switching element and a single FET. The NT-FET devices may exhibit certain desirable characteristics, such as the ability to drive different types of circuits, including CMOS circuits, and low leakage currents. In preferred embodiments, the NT-FET devices are non-volatile.

FIG. 1A illustrates an integrated non-volatile nanotube switch and PFET device 10, referred to as a non-volatile NT-PFET device 10, connected in a pull-up arrangement. Non-volatile NT-PFET device 10 is a four-terminal device. Non-volatile NT-PFET device 10 has two control input terminals 40 and 40' and an output terminal 45. Non-volatile NT-PFET device 10 also has a signal input terminal 25. In the illustrated embodiment, NT-PFET device 10 is tied to a power source, $V_{DD}$, at signal input terminal 25. In alternate embodiments, NT-PFET device 10 may also be connected to some other type of input signal, e.g., an output from another logic device or circuit, in place of the power supply. In the illustrated embodiment, the two control inputs 40 and 40' are connected to complementary input signals $A_T$ and $A_C$. As used herein, "T" designates a "true" signal and "C" designates its complement. This designation indicates a preferred mode of operation (dual-rail differential input) for the device. In alternate embodiments, PFET device 30 may be connected to signal input terminal 25 and nanotube switching element 20 may be connected to output 45.

The non-volatile NT-PFET device 10 includes a non-volatile nanotube switching element 20 and a PFET device 30. The construction and operation of non-volatile nanotube switching element 20 is described in more detail below. In preferred embodiments, the conductive channel element of non-volatile nanotube switching element 20 is formed of a porous nanotube fabric. Non-volatile nanotube switching element 20 has an input electrode, which is the input signal contact for the nanotube channel element. The input electrode of non-volatile nanotube switching element 20 forms the signal input terminal 25 of NT-PFET device 10, which is connected to $V_{DD}$. The non-volatile nanotube switching element 20 output is connected to the source of PFET device 30 at common terminal 35. Non-volatile nanotube switching element 20 also has a control structure, including two control input terminals, for controlling the channel formation of the switching element. The control input terminals are referred to herein as a control or set electrode and a release electrode. The set electrode of non-volatile nanotube switch 20 is connected to the gate of PFET device 30 to form a common control node at control input terminal 40, which is activated by input $A_T$. Control input terminal 40' is connected to the release electrode of switch 20, and is activated by input $A_C$, the complement of input $A_T$. The drain of PFET device 30 forms the output of non-volatile NT-PFET device 10 at node 45.

FIG. 1B illustrates an integrated non-volatile nanotube switch and NFET device 50, referred to as a non-volatile NT-NFET device 50, connected in a pull-down arrangement. Non-volatile NT-NFET device 50 is a four-terminal device. Non-volatile NT-NFET device 50 has two control input terminals 80 and 80' and an output terminal 85. Non-volatile NT-NFET device 50 also has a signal input terminal 55. In the illustrated embodiment, NT-NFET device 50 is grounded at signal input terminal 55. In alternate embodiments, NT-NFET device 50 may also be connected to some other type of input signal, e.g., an output from another logic device or circuit, rather than being grounded. In the illustrated embodiment, the two control terminals 80 and 80' are connected to complementary input signals $A_T$ and $A_C$.

The non-volatile NT-NFET device 50 includes a non-volatile nanotube switching element 60 and a NFET device 70. The construction of non-volatile nanotube switching element 60 is similar to that of nanotube switching element 20 and is described in more detail below. In preferred embodiments, the conductive channel element of non-volatile nanotube switch 60 is formed of a porous nanotube fabric. Non-volatile nanotube switch 60 has an input electrode, which is the input signal contact with the nanotube channel element. The input electrode of non-volatile nanotube switch 60 forms the signal input terminal 55 of NT-NFET device 50, which is grounded. The non-volatile nanotube switching element 60 output is connected to the source of NFET device 70 at common terminal 75. Non-volatile nanotube switching element 60 also has a control structure with two control input terminals for controlling the switching of the element. The set electrode of non-volatile nanotube switching element 60 is connected to the gate of NFET device 70 to form a common node at control input terminal 80', which is activated by input $A_T$. Control input terminal 80 is connected to the release node of switching element 60, and is activated by input $A_C$. The drain of NFET device 70 forms the output of non-volatile NT-NFET device 50 at output terminal 85.

FIG. 1C is a cross sectional view of a preferred nanotube switching element 100. Nanotube switching element includes a lower portion having an insulating layer 117, control electrode 111, and output electrodes 113c,d. Nanotube switching element further includes an upper portion having release electrode 112, output electrodes 113a,b, and signal electrodes 114a,b. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113a,b are made of conductive material and are separated from nanotube channel element 115 by insulating material 119.

Output electrodes 113c,d are likewise made of conductive material and are separated from nanotube channel element 115 by a gap height G103. Notice that the output electrodes 113c,d are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114a,b each contact the nanotube channel element 115 and can therefore supply whatever signal is on the signal electrode to the channel element 115. This signal may be a fixed reference signal (e.g., $V_{DD}$ or Ground) or varying (e.g., a Boolean discrete value signal that can change). Only one of the electrodes 114a,b need be connected, but both may be used to reduce effective resistance.

Nanotube channel element 115 is a lithographically-defined article made from a porous fabric of nanotubes (more below). It is electrically connected to signal electrodes 114a,b. The electrodes 114a,b and support 116 pinch or hold the channel element 115 at either end, and it is suspended in the middle in spaced relation to the output electrodes 113a–d and the control electrode 111 and release electrode 112. The spaced relationship is defined by the gap heights G102–G104 identified above. For certain embodiments, the length of the suspended portion of channel element 115 is about 300 to 350 nm.

Under certain embodiments the gaps G103, G104, G102 are in the range of 5–30 nm. The dielectric on terminals 112, 111, and 113a and 113b are in the range of 5–30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

Figure 1D:
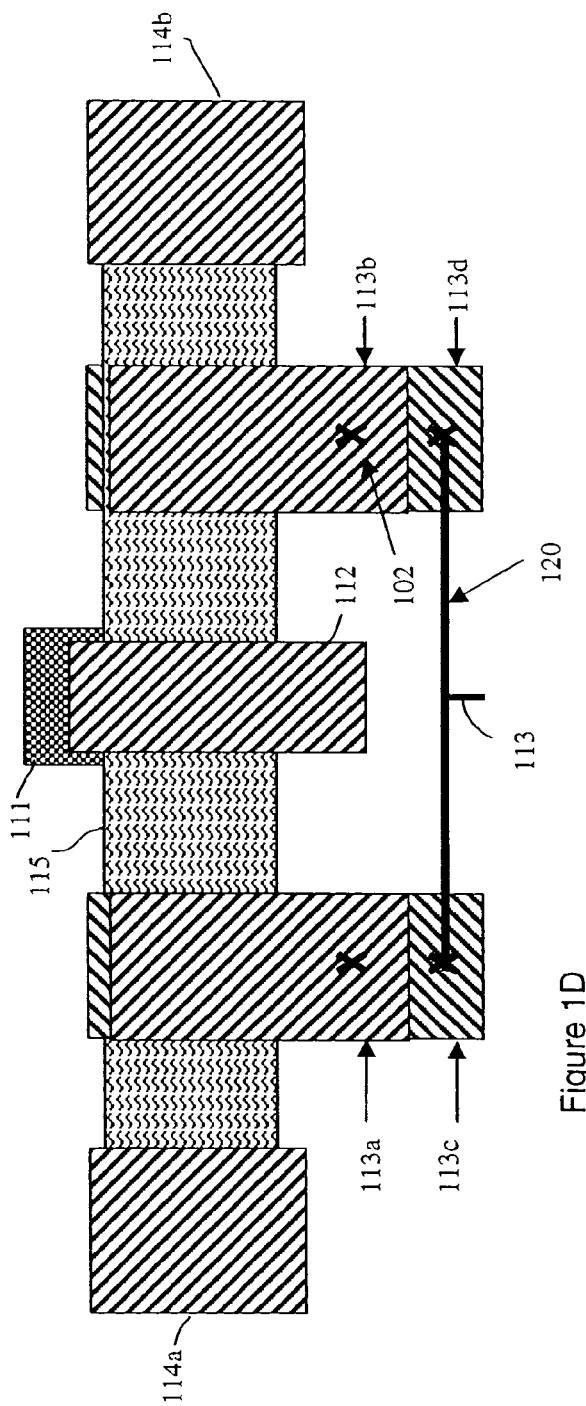

FIG. 1D is a plan view or layout of nanotube switching element 100. As shown in this figure, electrodes 113b,d are electrically connected as depicted by the notation 'X' and item 102. Likewise electrodes 113a,c are connected as depicted by the 'X'. In preferred embodiments the electrodes are further connected by connection 120. All of the output electrodes collectively form an output node 113 of the switching element 100.

Figure 1E:
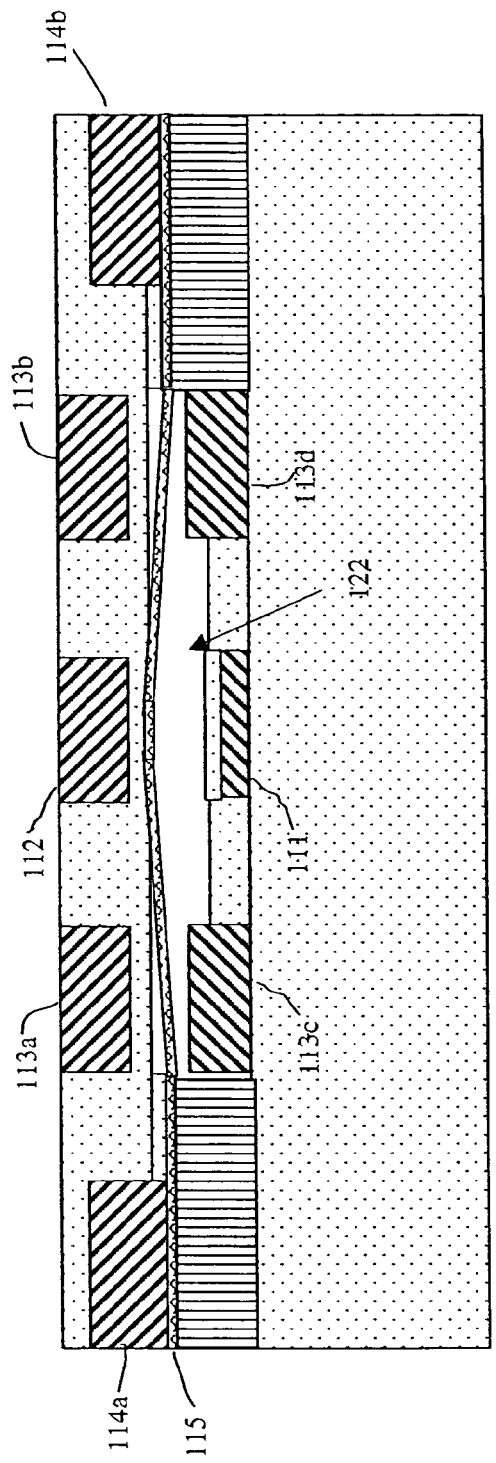
FIGS. 1E and 1F illustrate cross sectional views of different positional and electrical states of a nanotube switching element fabricated according to preferred embodiments of the invention.
Figure 1F:
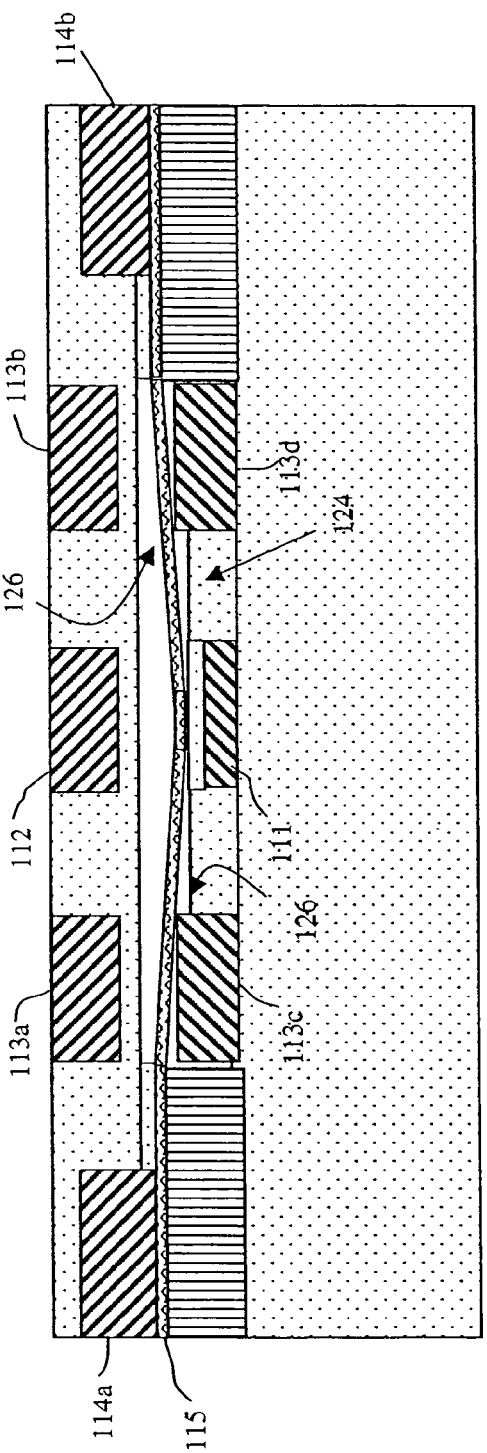

Under preferred embodiments, the nanotube switching element 100 of FIGS. 1C and 1D operates as shown in FIGS. 1E and F. Specifically, nanotube switching element 100 is in an OPEN (OFF) state when nanotube channel element is in position 122 of FIG. 1E. In such state, the channel element 115 is drawn into mechanical contact with dielectric layer 119 via electrostatic forces created by the potential difference between electrode 112 and channel element 115. Output electrodes 113a,b are in mechanical contact (but not electrical contact) with channel element 115. Nanotube switching element 100 is in a CLOSED (ON) state when channel element 115 is elongated to position 124 as illustrated in FIG. 1F. In such state, the channel element 115 is drawn into mechanical contact with dielectric layer 118 via electrostatic forces created by the potential difference between electrode 111 and channel element 115. Output electrodes 113c,d are in mechanical contact and electrical contact with channel element 115 at regions 126. Consequently, when channel element 115 is in position 124, signal electrodes 114a and 114b are electrically connected with output terminals 113c,d via channel element 115, and the signal on electrodes 114a,b may be transferred via the channel (including channel element 115) to the output electrodes 113c,d.

By properly tailoring the geometry of nanotube switching element 100, the nanotube switching element 100 may be made to behave as a non-volatile or a volatile switching element. By way of example, the device state of FIG. 1F may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 100 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described in the incorporated patent references.) This deflection is depicted in FIG. 1F (and 1E). The attractive force stretches and deflects the nanotube fabric of channel element 115 until it contacts the insulated region 118 of the electrode 111. The nanotube channel element is thereby strained, and there is a restoring tensile force, dependent on the geometrical relationship of the circuit, among other things.

By using appropriate geometries of components, the switching element 100 then attains the closed, conductive state of FIG. 1F in which the nanotube channel 115 mechanically contacts the control electrode 111 and also output electrode 113c,d. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 1E. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 1C) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 1C. Instead, the electrodes 111 and 112 are expected to be operated so that the channel element 115 will either be in the state of FIG. 1E or 1F.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113b,d (and also 113a,c) of equal potential. Consequently, there are equal but opposing electrostatic forces that result from the voltage on the output node. Because of the equal and opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

To facilitate the description of such circuits and to avoid the complexity of the layout and physical diagrams of FIGS. 1C–F, a schematic representation has been developed to depict the switching elements.

FIG. 2A is a schematic representation of a nanotube switching element 100 of FIG. 1C. The nodes of the schematic use the same reference numerals with an appended (') to indicate the correspondence between the schematic and the components of nanotube switching element 100. Nodes 114' and 115' represent the signal electrode terminal and nanotube channel element contact. Node 111' represents the control electrode. Node 112' represents the release electrode. Node 113' represent the output electrode.

FIGS. 2B–C depict a nanotube channel element 100 when used in a pull-up arrangement and its states of operation. For example, FIG. 2B is a schematic representation of the nanotube switching element in the OPEN (OFF) state illustrated in FIG. 1E, in which node 114 and the nanotube channel element 115 are at $V_{DD}$, the control electrode 111 is at a positive voltage, typically $V_{DD}$, and the release electrode 112 is at zero volts. The nanotube channel element is not in electrical contact with output node 113. FIG. 2C is a schematic representation of the nanotube switching element in the CLOSED (ON) state illustrated in FIG. 1F. In this case, signal node 114 and the nanotube channel element 115 are at $V_{DD}$, the control electrode 111 is at zero volts, and the release electrode 112 is at a positive voltage, typically $V_{DD}$. The nanotube channel element is deflected into mechanical and electrical contact with the output node 113. Moreover, if as described above, geometries are selected appropriately, the contact will be non-volatile as a result of the Van der Waals forces between the channel element and the insulated control element 111 and the uninsulated portion of the output electrode. The state of electrical contact is depicted by the short black line 204 or 204' representing the nanotube channel element being insulated from (OFF) or electrically contacting (ON) the output terminal 113. Electrical contact results in the output node 113 assuming the same signal (i.e., $V_{DD}$) as the nanotube channel element 115 and signal node 114.

FIGS. 3A–C are analogous to those of FIGS. 2A–C, except that they depict a nanotube switching element 100 and its states when used as a pull-down device.

In FIGS. 2 and 3, the nanotube switching element is always operated in a way (at least when power is applied) that the signals applied to the control electrode 111 and the release electrode 112 are of opposite voltage values. If, for example, control 111 is at zero volts, then release 112 is at a positive voltage, typically $V_{DD}$. If, however, control electrode 111 is at a positive voltage, typically $V_{DD}$, then release electrode 112 is at zero volts. If a positive voltage is associated with a logic "1" state, and a zero voltage is associated with a logic "0" state, then logic states applied to control and release are true and complement, respectively (or complement and true, respectively). The notation adopted for FIGS. 2 and 3 is also used in FIGS. 4 and 5.

Referring again to FIGS. 1A and 1B, in preferred embodiments, FETs 30 and 70 are conventional MOS FETs. NT-FET devices 10 and 50 retain the driving characteristics of MOS devices because FETs 30 and 70 are connected to the respective output nodes 25 and 55. Thus, NT-FET devices 10 and 50 may be readily integrated with and interconnected to conventional CMOS circuitry. In certain embodiments, the interconnect wiring used to interconnect the device terminals to other devices may be conventional wiring such as AlCu, W, or Cu wiring with appropriate insulating layers such as $SiO_2$, polyimide, etc, or may be single or multi-wall nanotubes used for wiring.

In operation, the output signal provided on output terminal 45 of NT-PFET device 10 is controlled by input signal $A_T$ (on control input terminal 40) and its complement $A_C$ (on control input terminal 40'). When $A_T$ is high: (1) both the set electrode (connected to terminal 40) and the nanotube channel element within nanotube switching element 20 are high, and nanotube switching element 20 remains off; and (2) PFET 30 has a high voltage on its gate (connected to terminal 40) and also remains off. Note that since nanotube switching element is not conducting, it acts as a valve and can reduce standby leakage currents in FET 30. When $A_T$ is low: (1) the set electrode is low but the nanotube channel element within nanotube switching element 20 is high, and nanotube switching element 20 turns on; and (2) PFET 30 has a low voltage on its gate and also turns on. When $A_T$ is low, NT-PFET device 10 is ON and the voltage at output terminal 45 is $V_{DD}$. The integrated NT-FET devices and associated structures and logic circuits of the preferred embodiments offer a solution to the CMOS power dissipation problem. There is no significant leakage current between input and output terminals in the "OFF" state of the nanotube switching element, and there is no junction leakage. The use of nanotube switching elements in series with FETs limits the leakage currents in such integrated devices. The nanotube switching element 20, 60 contained within each device 10 and 50 provides a low leakage path when turned off (with power supply still on) even if FET devices 30 and 70 have high OFF-current leakage. The nanotube switching elements may operate in harsh environments such as elevated temperatures, e.g., 150 to 200 deg-C. or higher.

Similarly, the output signal provided on output terminal 85 of NT-NFET device 50 is controlled by input signal $A_T$ (connected to control input terminal 80') and its complement $A_C$ (connected to control input terminal 80) When $A_T$ is low: (1) both the set electrode (connected to terminal 80') and the channel element within nanotube switching element 60 are low, and nanotube switching element is off; and (2) NFET 70 has a low voltage on its gate (connected to terminal 80') and also remains off. When $A_T$ is high: (1) the set electrode is high but the channel element within nanotube switching element 60 is low, and nanotube switching element 60 turns on. When $A_T$ is high, NT-PFET device 60 is ON and the voltage at output terminal 85 is GND.

In preferred embodiments, NT-FET devices 10 and 50 are sized so that they are non-volatile. The nanotube switching element 20, 60 contained within each device 10, 50 provides a non-volatile element that retains the state of the device when power to the device 10, 50 is removed or interrupted. Thus, NT-FET devices 10 and 50 can be used to perform logic operations when activated, preserve the logic state in a non-volatile mode when powered down and resume operations from the preserved state, without any additional steps or circuitry for saving or restoring the logic states. Alternatively, NT-FET devices 10 and 50 may be sized so that they are volatile.

The NT-FET devices 10 and 50 are integrated at the device level. NT-FET devices 10 and 50 may be operated in a dual-rail differential fashion and can be used as the basic building blocks to provide a non-volatile complementary hybrid NT-FET logic family. NOT and NOR circuits can be formed using techniques described herein and known logic design principles and used be used to implement any logical function.

This hybrid logic family exhibits desirable characteristics of both MOS and NT components. As noted above, this hybrid logic family retains the drive capabilities of conventional CMOS. Operation of the NT-FET devices 10 and 50 as building blocks for a non-volatile dual-rail differential logic family can be further understood by reference to the inverter circuits depicted in FIGS. 4 and 5. The inverter designs are based on the principles taught herein and in the related, incorporated patent references and known logic design principles.

FIG. 4A illustrates the operation of non-volatile NT-PFET device 10 and non-volatile NT-NFET device 50, where nonvolatile NT-PFET device 10 and NT-NFET device 50 are connected to form a dual-rail input single-rail output inverter 400. Inverter 400 is formed by connecting terminal 45 of NT-PFET device 10 to terminal 85 of NT-NFET device 50. Connected terminals 45 and 85 form output Aout of inverter 400. Inverter input $A_T$ is connected to the control terminal of switching element 20, the control terminal of switching element 60, and the gate of PFET 30 and the gate of NFET 70. Input $A_C$ is connected to the release electrodes of switches 20 and 60. FIGS. 4B and 4C illustrate input and output voltages, and the position of the nanotube switch.

In operation, FIG. 4B illustrates inverter 400 in logic state 400', where input $A_C$ is at zero volts and input $A_T$ is at a positive voltage, $V_{DD}$ for example, and output Aout is at zero volts. Switch 20 and PFET 30 are in the "OFF" state, and switch 60 and NFET 70 are in the "ON" state. A conductive path is formed through NFET 70 and switch 60 that electrically connects output Aout to ground. PFET 30 and switch 20 are in the "OFF" state, and no path exists between output Aout and voltage $V_{DD}$.

In operation, FIG. 4C illustrates inverter 400 in logic state 400", where input $A_C$ is at a positive voltage, $V_{DD}$ for example, and input $A_T$ is at zero volts, and output Aout is at a positive voltage, $V_{DD}$ for example. Switch 20 and PFET 30 are in the "ON" state, and switch 60 and NFET 70 are in the "OFF" state. A conductive path is formed through PFET 30 and switch 20 that electrically connects output Aout to voltage $V_{DD}$. NFET 70 and switch 60 are in the "OFF" state, and no path exists between output Aout and ground.

Figure 4D:
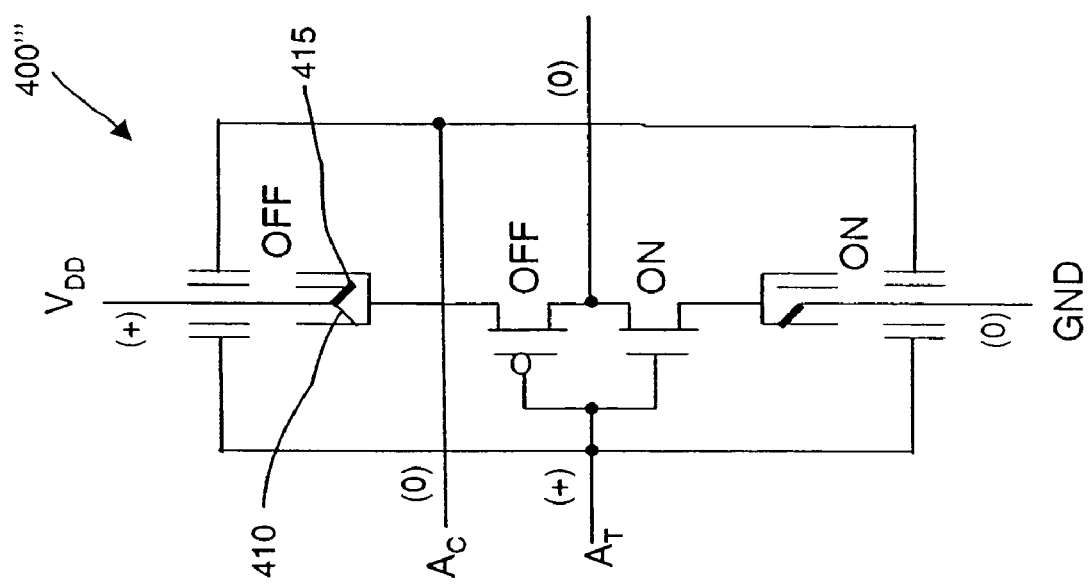
FIG. 4D is a schematic representation of the inverter of FIG. 4A in one possible logic state.

An additional advantage of the hybrid NT-FET device family is illustrated in FIG. 4D. In contrast with FIG. 4B, FIG. 4D illustrates a logic state 400''' in which switch 20 is not completely turned OFF. In this example, one fiber 410 remains connected between the carbon nanotube fabric and the output electrode, while the remaining fibers 415 are no longer in contact with the output electrode. This may occur due to a manufacturing defect, for example. While the output signal will not be affected, fiber 410 will conduct a leakage current. Because PFET 30 is in the "OFF" state, the leakage current of nonvolatile inverter 100 in state 100' remains small. Thus, PFET 30 defines a worst case leakage current.

Figure 5C:
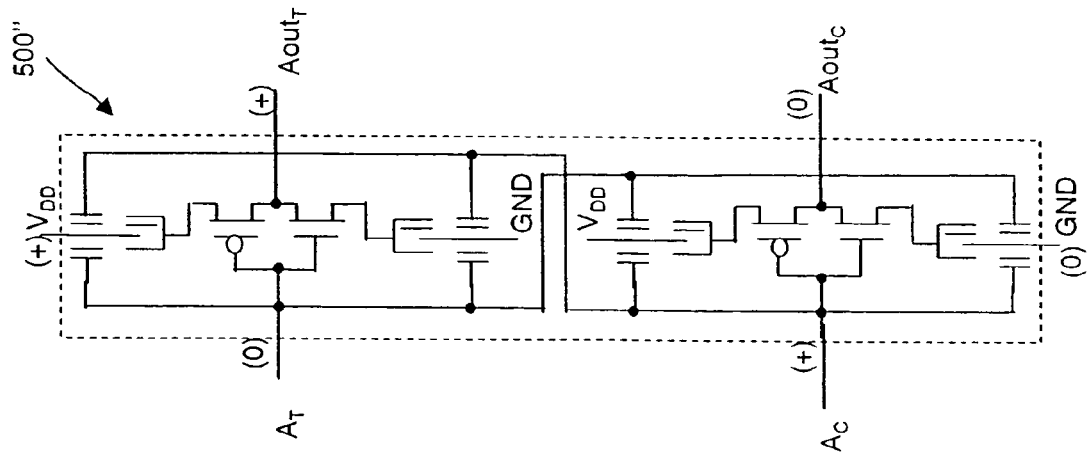
FIG. 5C is a schematic representation of the dual-rail inverter of FIG. 5A in one possible logic state.
Figure 5B:
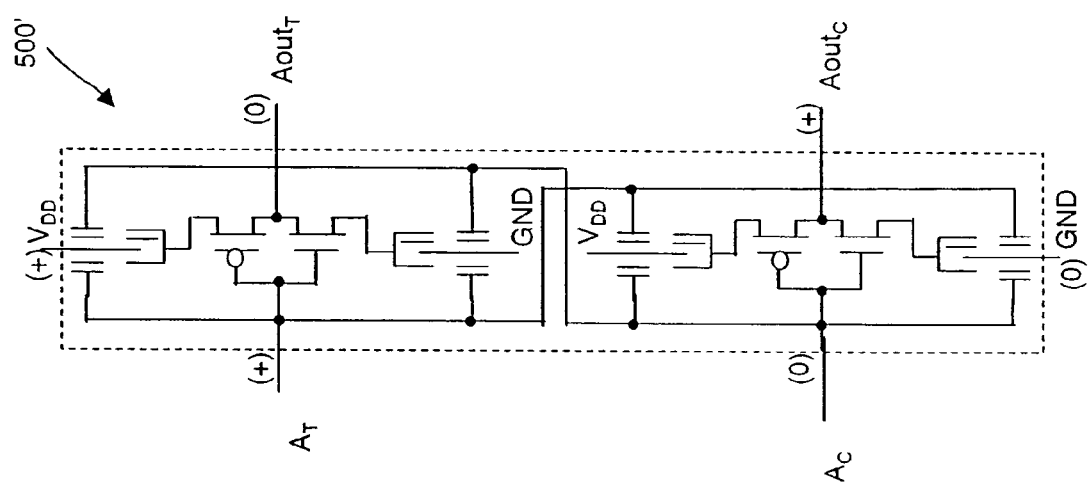
FIG. 5B is a schematic representation of the dual-rail inverter of FIG. 5A in one possible logic state.
Figure 5A:
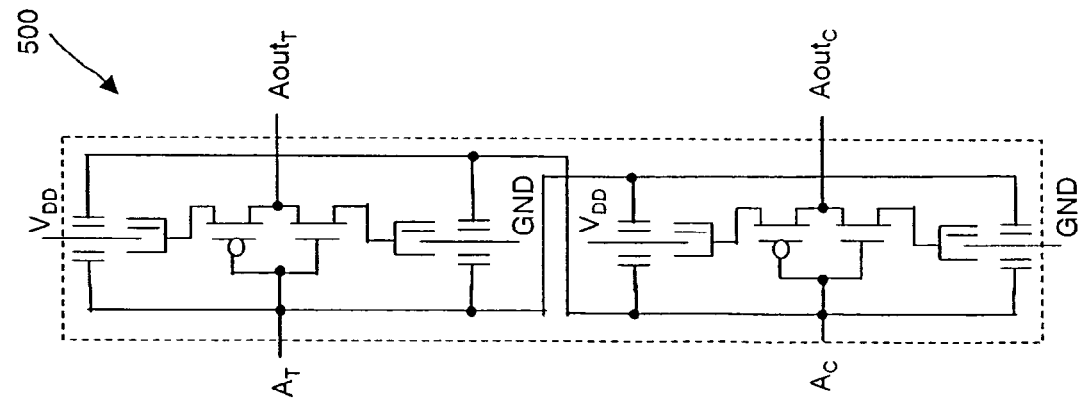
FIG. 5A is a schematic representation of a dual-rail input and output non-volatile inverter constructed using non-volatile integrated NT-PFET devices and non-volatile integrated NT-NFET devices according to one aspect of the invention.

FIG. 5A illustrates a dual-rail input and output nonvolatile inverter 500 formed using two dual-rail input and single-rail output inverters 400 interconnected as shown. In operation, dual-rail inverter 500 is shown in logic state 500' in FIG. 5B, where input $A_T$ is a positive voltage and input $A_C$ is at zero volts, and output $Aout_T$ is at zero volts and output $Aout_C$ is at a positive voltage. Combined nanotube and MOS inverter 500 operates in a nonvolatile mode, that is, the inverter logic state is preserved if power is removed. Inverter 500 also limits leakage currents in cases where nanotube fibers do not all switch to the "OFF" state.

FIG. 5C illustrates operation of dual-rail inverter 500, shown in logic state 500", where input $A_T$ is zero volts and input $A_C$ is at a positive voltage, and output $Aout_T$ is at a positive voltage and output AoutC is zero volts. Combined nanotube and MOS inverter 500 operates in a nonvolatile mode, that is, the inverter logic state is preserved if power is removed. Inverter 500 also limits leakage currents in cases where nanotube fibers do not all switch to the "OFF" state, as illustrated in FIG. 4D.

The switching behavior of some embodiments of NT-FETs has been described in detail herein. NT-FETs can be arranged as pull-up or pull-down structures. These pull-up and pull-down structures can be arranged into gates and larger circuits such as Boolean logic circuits. NOR gates and other logic gates can be constructed using NT-FETs using the layouts discussed in the related, incorporated patent references, together with the present disclosure and conventional pull-up/pull-down techniques from conventional CMOS.

It will also be appreciated that additional implementations or types of NT-FET switching devices can be developed by interconnecting networks of non-volatile switching elements and networks of FETs. While the specification has offered specific examples of the schematic layout of a dual-rail single-output inverter and a dual-rail dual-output inverter, it will be appreciated that the NT-FET building blocks of preferred embodiments may be used to derive a complete logic family that can be used to implement any logical function. It is well known to construct circuits with networks of pull-up and pull-down elements, e.g., CMOS circuits. This technology can also be used to implement latches and other storage devices. The technology can be used in all present memory devices such as DRAM, SRAM, Flash, EEPROM, PROM, ASICs, etc. Also, all logic functions such as microprocessors, controllers, digital signal processors, adders, ramdom logic, PLAs, FPGAs, etc. can be fabricated with this invention. Preferred embodiments of NT-FET devices are compatible with MOS technology and are compatible with MOS at the block or function level. NT-FET devices also enable embedding combined nanotube-based logic and MOS circuits in new and existing MOS (and/or nanotube logic) designs at the individual circuit level.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, the nanotube switching elements may have any suitable architecture. Architectures of nanotube switches preferred for use in embodiments of the present invention are discussed in U.S. application Ser. Nos. 10/917,794 and 10/918,085, which are incorporated by reference herein. Although the NT-FET devices are described herein primarily as four-terminal devices, various embodiments may have different configurations. For example, if the nanotube switching element component of an NT-FET device does not have a release electrode, then the NT-FET device may be only a three-terminal device, with only one control input terminal. In various embodiments, the devices may incorporate networks of nanotube switches and/or networks of field-modulatable switches. Any suitable integrated architecture may be used and the use of nanotube or field modulatable switching components with discrete architectures as components is not a limitation of the invention. Certain embodiments may incorporate an electrically conductive channel having a nanotube channel element and a field modulatable semiconductor channel element without using discretely identifiable nanotube and field modulatable switch architectures.

The inventors envision additional configurations of volatile and nonvolatile or mixed nanoelectromechanical designs depending upon the specific application, speed, power requirements and density desired. Additionally the inventors foresee the use of multiwalled carbon nanotubes or nanowires as the switching element of contact points within the nanotube switches. As the technology node decreases in size from 90 nm to 65 nm and below down to the size of individual nanotubes or nanowires the inventors foresee adapting the basic electromechanical switching elements and their operation to a generation of nanoscale devices with scaleable performance characteristics concomitant with such size reduction. It will also be appreciated that the invention is not limited to the use of carbon nanotubes.

The following patent references refer to various techniques for creating nanotube fabric articles and switches and are assigned to the assignee of this application. Each is hereby incorporated by reference in its entirety.

Electromechanical Memory Having Cell Selection Circuitry Constructed With Nanotube Technology (U.S. Pat. No. 6,643,165), filed on Jul. 25, 2001;

Electromechanical Memory Array Using Nanotube Ribbons and Method for Making Same (U.S. patent application Ser. No. 09/915,093), filed on Jul. 25, 2001;

Hybrid Circuit Having Nanotube Electromechanical Memory (U.S. Pat. No. 6,574,130), filed on Jul. 25, 2001;

Electromechanical Three-Trace Junction Devices (U.S. patent application Ser. No. 10/033,323), filed on Dec. 28, 2001;

Methods of Making Electromechanical Three-Trace Junction Devices (U.S. patent application Ser. No. 10/033,032), filed on Dec. 28, 2001;

Nanotube Films and Articles (U.S. Pat. No. 6,706,402), filed Apr. 23, 2002;

Methods of Nanotube Films and Articles (U.S. patent application Ser. No. 10/128,117), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Electro-Mechanical Switches and Memory Cells Using Horizontally-Disposed Nanofabric Articles and Methods of Making the Same, (U.S. Provisional Pat. Apl. Ser. No. 60/446,783), filed Feb. 12, 2003; now Devices Having Horizontally-Disposed Nanofabric Articles and Methods of Making the Same (U.S. patent application Ser. No. 10/776,059), filed Feb. 11, 2004;

Electromechanical Switches and Memory Cells using Vertically-Disposed Nanofabric Articles and Methods of Making the Same (U.S. Provisional Pat. Apl. Ser. No. 60/446,786), filed Feb. 12, 2003; now Devices Having Vertically-Disposed Nanofabric Articles and Methods of Making the Same (U.S. patent application Ser. No. 10/776,572), filed Feb. 11, 2004.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An integrated switching device, comprising:
a signal input terminal;
an output terminal; and
a control structure including at least one control input terminal, electrical stimulation of said control structure controlling formation of a controllably-formable electrically conductive channel between the signal input terminal and the output terminal, a first portion of the electrically conductive channel including a nanotube channel element and a second portion of the electrically conductive channel including a field modulatable semiconductor channel element, wherein the integrated switching device is volatile.

2. An integrated switching device, comprising:
a signal input terminal;
an output terminal; and
a control structure including at least one control input terminal, electrical stimulation of said control structure controlling formation of a controllably-formable electrically conductive channel between the signal input terminal and the output terminal, a first portion of the electrically conductive channel including a nanotube channel element and a second portion of the electrically conductive channel including a field modulatable semiconductor channel element,
wherein the control structure comprises a first control input terminal and a second control input terminal, and wherein the formation of the first portion of the electrically conductive channel is controlled by both the first and second control input terminals and the formation of the second portion of the electrically conductive channel is controlled by only the first control input terminal.

3. An integrated switching device, comprising:
a signal input terminal;
an output terminal;
a nanotube switching element, including a nanotube channel element formed of at least one nanotube, and a nanotube input electrode for providing a signal to the nanotube channel element, the nanotube input electrode being electrically connected to said signal input terminal, and a nanotube output electrode for receiving a signal from the nanotube channel element when the nanotube channel element is activated;
a field effect device having a source, a drain, and a gate, with a field modulatable channel between the source and the drain, the source being electrically connected to the output electrode of the nanotube switching element and the drain being electrically connected to said output terminal; and
a control structure comprising at least one control input terminal to control formation of a controllably-formable conductive channel between said signal input terminal and said output terminal, a first portion of the conductive channel being formed by the nanotube channel element of the nanotube switching element, and a second portion of the conductive channel being formed by the field modulatable channel of the field effect device, wherein the device is volatile.

4. An integrated switching device, comprising:
a signal input terminal;
an output terminal;
a network of at least one nanotube switching element electrically disposed between said signal input terminal and said output terminal;
a network of at least one field effect device electrically disposed between said signal input terminal and said output terminal, said network of at least one field effect device being electrically in series with said network of at least one nanotube switching element; and
a control structure to control formation of a controllably-formable conductive channel between said signal input terminal and said output terminal, a first portion of the conductive channel being provided by a conductive path formed by the network of at least one nanotube switching element and a second portion of the conductive channel being provided by a conductive path formed by the network of at least one field effect device, wherein the device is volatile.

5. A Boolean logic circuit, comprising:
at least one input terminal and an output terminal;
a network of pull-up and pull-down circuits electrically disposed between the at least one input terminal and the output terminal;
each pull-up circuit including at least one nanotube switching element and at least one p-channel field effect device connected in series; and
each pull-down circuit including at least one nanotube switching element and at least one n-channel field effect device connected in series;
said network of pull-up and pull-down circuits effectuating a Boolean function transformation of Boolean signals applied to said at least one input terminal and providing the Boolean result on the output terminal.

6. The Boolean logic circuit of claim 5, wherein the circuit is non-volatile.

7. The Boolean logic circuit of claim 5, wherein the circuit is volatile.

8. The Boolean logic circuit of claim 5, wherein the circuit has two input terminals that are complementary.

9. The Boolean logic circuit of claim 5, wherein the circuit has two input terminals that are complementary and has two output terminals that are complementary.

10. A logical inverter circuit, comprising:
electrical control signal inputs including a first and a second input;
a field modulatable semiconductor channel element having a drain, a source, and a gate, with a field modulatable channel between the source and the drain; and,
a nanotube switching element including an input node, an output node, a nanotube channel element having at least one electrically conductive nanotube, and a control structure disposed in relation to the nanotube channel element to controllably form and unform an electrically conductive channel between said input node and said output node wherein said channel at least includes said nanotube channel element, wherein the gate of the field modulatable semiconductor channel element is connected to one of the first and the second inputs, wherein the control structure of the nanotube switching element is connected to both of the first and the second inputs, wherein the output of the nanotube switching element is connected to one of the drain and source of the field modulatable semiconductor channel element, and wherein the other of the drain and the source defines an output terminal for the logical inverter circuit.

11. The logical inverter circuit of claim 10, wherein the nanotube switching element is non-volatile.

12. The logical inverter circuit of claim 10, wherein the nanotube switching element is volatile.

13. The logical inverter circuit of claim 10, wherein the control structure includes a control electrode and a release electrode disposed on opposite sides of the nanotube channel element.

14. The logical inverter circuit of claim 13, wherein:
the field modulatable channel is a p-channel; and
the input node of the nanotube switching element is connected to a standard voltage, the control electrode is connected to the first input, the release electrode is connected to the second input, the output node of the nanotube switching element is connected to the source of the field modulatable semiconductor channel element, and the gate of the field modulatable semiconductor channel element is connected to the first input.

15. The logical inverter circuit of claim 13, wherein:
the field modulatable channel is a n-channel; and
the input node of the nanotube switching element is connected to a reference voltage, the control electrode is connected to the second input, the release electrode is connected to the first input, the output electrode of the nanotube switching element is connected to the drain of the field modulatable semiconductor channel element, and the gate of the field modulatable semiconductor channel element is connected to the second input.

16. The logical inverter circuit of claim 10, wherein signals on the first and the second inputs are logical complements of each other.

17. The logical inverter circuit of claim 10, wherein at least one of the first and the second inputs creates an ON state by inducing formation of the electrically conductive channel and the nanotube channel element is positioned and arranged to limit leakage currents between at least one of the first and the second inputs and the output terminal when the logical inverter circuit is not in the ON state.

18. The logical inverter circuit of claim 10, wherein the logical inverter circuit is capable of driving a CMOS circuit connected to the output terminal.

19. A dual rail input, single rail output logic circuit comprising:
electrical control signal inputs including a first and a second input rail;
a network of at least one field modulatable semiconductor channel element, each of said at least one field modulatable semiconductor channel element having a drain, a source, a gate, and a field modulatable channel between the source and the drain;
a network of at least one nanotube switching element, each of said at least one nanotube switching elements including an input node, an output node, a nanotube channel having at least one electrically conductive nanotube, and a control structure disposed in relation to the nanotube channel element to controllably form and unform an electrically conductive channel between said input node and said output node, wherein said electrically conductive channel at least includes said nanotube channel element,
wherein the gate of each of the at least one field modulatable semiconductor channel elements is connected to one of the first and the second input rails, wherein the control structure of each of the at least one nanotube switching elements is connected to both the first and the second input rail, wherein the output of each nanotube switching element is connected to one of the drain and the source of at least one field modulatable semiconductor channel element, and wherein the other of the drain and the source defines an output rail for the logical inverter circuit.

20. The dual rail input, single rail output logic circuit of claim 19, wherein the nanotube switching elements are non-volatile.

21. The dual rail input, single rail output logic circuit of claim 19, wherein the nanotube switching elements are volatile.

22. The dual rail input, single rail output logic circuit of claim 19, wherein signals on the first and the second inputs are logical complements of each other.

23. The dual rail input, single rail output logic circuit of claim 19, wherein the control structure of each of the at least one nanotube switching element further includes a control electrode and a release electrode disposed on opposite sides of the nanotube channel element.

24. The dual rail input, single rail output logic circuit of claim 19, wherein said at least one field modulatable semiconductor channel element includes a p-channel.

25. The dual rail input, single rail output logic circuit of claim 19, wherein said at least one field modulatable semiconductor channel element includes a n-channel.

26. The dual rail input, single rail output logic circuit of claim 19, wherein the logic circuit is capable of driving a CMOS circuit connected to the output rail.

* * * * *